(12) United States Patent
Iwaya et al.

(10) Patent No.: US 10,377,870 B2
(45) Date of Patent: Aug. 13, 2019

(54) ELONGATED GAS BARRIER LAMINATE AND METHOD FOR PRODUCING SAME

(71) Applicant: LINTEC CORPORATION, Tokyo (JP)

(72) Inventors: Wataru Iwaya, Tokyo (JP); Koichi Nagamoto, Tokyo (JP); Satoshi Naganawa, Tokyo (JP); Yuuta Suzuki, Tokyo (JP); Takeshi Kondo, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/128,028

(22) PCT Filed: Mar. 27, 2015

(86) PCT No.: PCT/JP2015/059728
§ 371 (c)(1),
(2) Date: Sep. 21, 2016

(87) PCT Pub. No.: WO2015/152077
PCT Pub. Date: Oct. 8, 2015

(65) Prior Publication Data
US 2017/0107344 A1    Apr. 20, 2017

(30) Foreign Application Priority Data
Mar. 31, 2014   (JP) ................ 2014-073106

(51) Int. Cl.
| B05D 1/42 | (2006.01) |
| --- | --- |
| B05D 3/12 | (2006.01) |
| B05D 3/14 | (2006.01) |
| B05D 5/00 | (2006.01) |
| B05D 7/00 | (2006.01) |
| B05D 7/04 | (2006.01) |
| B05D 7/24 | (2006.01) |
| B32B 27/28 | (2006.01) |
| B32B 7/02 | (2019.01) |
| C08J 7/04 | (2006.01) |
| H01B 1/04 | (2006.01) |
| H01J 37/32 | (2006.01) |
| H01L 51/00 | (2006.01) |
| H01L 51/52 | (2006.01) |

(52) U.S. Cl.
CPC ............... *C08J 7/042* (2013.01); *B05D 1/42* (2013.01); *B05D 3/12* (2013.01); *B05D 3/148* (2013.01); *B05D 5/00* (2013.01); *B05D 7/04* (2013.01); *B05D 7/24* (2013.01); *B05D 7/588* (2013.01); *B32B 7/02* (2013.01); *B32B 27/283* (2013.01); *C08J 7/045* (2013.01); *C08J 7/047* (2013.01); *H01B 1/04* (2013.01); *H01L 51/0024* (2013.01); *H01L 51/5253* (2013.01); *B32B 2307/7242* (2013.01); *C08J 2367/02* (2013.01); *C08J 2433/14* (2013.01); *C08J 2435/02* (2013.01); *C08J 2475/04* (2013.01); *C08J 2483/04* (2013.01); *C08J 2483/16* (2013.01); *H01J 37/32412* (2013.01)

(58) Field of Classification Search
CPC ........ C08J 7/042; C08J 7/047; C08J 2475/04; C08J 2367/02; C08J 2435/02; C08J 7/045; C08J 2483/16; C08J 2433/14; C08J 2483/04; B05D 7/24; B05D 3/148; B05D 1/42; B05D 3/12; B05D 5/00; B05D 7/588; B05D 7/04; H01J 37/32412; H01L 51/0024; H01L 51/5253; B32B 27/283; B32B 7/02; H01B 1/04
See application file for complete search history.

(56) References Cited

U.S. PATENT DOCUMENTS

| 4,965,050 A | 10/1990 | Funayama et al. |
| --- | --- | --- |
| 5,494,978 A | 2/1996 | Shimizu et al. |
| 8,771,834 B2 * | 7/2014 | Uemura .................... C08J 7/04 427/489 |
| 2004/0071986 A1 | 4/2004 | Shoshi et al. |
| 2010/0297473 A1 | 11/2010 | Iwase et al. |
| 2013/0143064 A1 * | 6/2013 | Paolilli ................. B29C 55/023 428/623 |
| 2013/0344345 A1 * | 12/2013 | Sakellarides ....... B29C 47/0057 428/458 |
| 2014/0322478 A1 | 10/2014 | Mori |
| 2015/0099094 A1 | 4/2015 | Suzuki et al. |

FOREIGN PATENT DOCUMENTS

| CN | 1493889 A | 5/2004 |
| --- | --- | --- |
| EP | 2415595 A1 | 2/2012 |
| JP | 62-195024 A | 8/1987 |
| JP | 63-81122 A | 4/1988 |
| JP | 1-138108 A | 5/1989 |
| JP | 2-84437 A | 3/1990 |
| JP | 2-175726 A | 7/1990 |

(Continued)

OTHER PUBLICATIONS

Author Unknown, 2018, Surface Roughness Conversions, General Magnaplate Corp.*

(Continued)

*Primary Examiner* — Nathan L Van Sell
(74) *Attorney, Agent, or Firm* — Birch, Stewart, Kolasch & Birch, LLP

(57) ABSTRACT

The present invention is a long gas barrier laminate including a base, a functional layer, a smoothing layer, and a gas barrier layer,
the functional layer being stacked on one side of the base,
the smoothing layer and the gas barrier layer being sequentially stacked on the other side of the base, and
a coefficient of static friction between a surface of the functional layer that is situated opposite to the base and a surface of the gas barrier layer that is situated opposite to the base being 0.35 to 0.80; and
a method for producing the long gas barrier laminate.

9 Claims, No Drawings

(56) References Cited

FOREIGN PATENT DOCUMENTS

| | | | |
|---|---|---|---|
| JP | 4-63833 A | 2/1992 | |
| JP | 5-238827 A | 9/1993 | |
| JP | 5-345826 A | 12/1993 | |
| JP | 6-122852 A | 5/1994 | |
| JP | 6-299118 A | 10/1994 | |
| JP | 6-306329 A | 11/1994 | |
| JP | 8-92727 A | 4/1996 | |
| JP | 9-31333 A | 2/1997 | |
| JP | 2003-154596 A | 5/2003 | |
| JP | 2011-93298 A | 5/2011 | |
| JP | 2012-106421 A | 6/2012 | |
| JP | 2013-226757 A | 11/2013 | |
| WO | 2010026852 A1 † | 3/2010 | |
| WO | WO 2010/026852 A1 | 3/2010 | |
| WO | WO-2012039357 A1 * | 3/2012 | ................ C08J 7/04 |
| WO | WO 2013/077255 A1 | 5/2013 | |
| WO | 2013147090 A1 † | 10/2013 | |
| WO | WO 2013/147090 A1 | 10/2013 | |

OTHER PUBLICATIONS

International Search Report for PCT/JP2015/059728 (PCT/ISA/210) dated Jun. 30, 2015.
Written Opinion of the International Searching Authority for PCT/JP2015/059728 (PCT/ISA/237) dated Jun. 30, 2015.
Extended European Search Report, dated Nov. 20, 2017, for corresponding European Application No. 15774061.4.
International Preliminary Report on Patentability and Written Opinion of the Internatuional Searching Authority (Forms PCT/IB/373 and PCT/ISA/237), dated Oct. 4, 2016, for International Application No. PCT/JP2015/059728, together with an English translation thereof.
Chinese Office Action dated May 30, 2019 for Chinese Application No. 201580018055.8.
Japanese Office Action dated Jun. 18, 2019 for Japanese Application No. 2016-511632.

\* cited by examiner
† cited by third party

ELONGATED GAS BARRIER LAMINATE AND METHOD FOR PRODUCING SAME

TECHNICAL FIELD

The present invention relates to a long gas barrier laminate that exhibits excellent workability when winding the long gas barrier laminate in the form of a roll, or unwinding the long gas barrier laminate that has been wound in the form of a roll, and a method for producing the same.

BACKGROUND ART

In recent years, a gas barrier film (in which a gas barrier layer is stacked on a transparent plastic film) has been used for displays (e.g., liquid crystal display and electroluminescence (EL) display) instead of a glass sheet (plate) in order to implement a reduction in thickness, a reduction in weight, flexibility, and the like.

It has been proposed to provide a smoothing layer on a base of the gas barrier film in order to reduce the degree of unevenness of the surface of the base, and improve interlayer adhesion.

For example, Patent Literature 1 discloses a transparent gas barrier film in which at least one surface smoothing layer and at least one inorganic barrier layer are stacked on a transparent plastic base, wherein the surface smoothing layer and the like have specific arithmetic average roughness.

A roll-to-roll method is normally used when producing a gas barrier film on an industrial scale.

For example, Patent Literature 2 discloses a method for producing a gas barrier film that includes winding a resin film having a smoothing layer (surface smoothing layer) that is provided on each side and has specific hardness in the form of a roll, and forming a gas barrier layer while unwinding the resin film.

CITATION LIST

Patent Literature

Patent Literature 1: JP-A-2003-154596
Patent Literature 2: WO2010/026852

SUMMARY OF INVENTION

Technical Problem

As described above, it is possible to improve interlayer adhesion by providing a smoothing layer to a gas barrier film, and thus improve the gas barrier capability and the like of the gas barrier film.

However, when producing such a gas barrier film using a roll-to-roll method, blocking (i.e., a state in which films adhere to each other), air entrainment (i.e., occurrence of wrinkles), and the like may occur when winding the gas barrier film in the form of a roll, or unwinding the gas barrier film that has been wound in the form of a roll.

The invention was conceived in view of the above situation. An object of the invention is to provide a long gas barrier laminate that exhibits excellent workability when winding the long gas barrier laminate in the form of a roll, or unwinding the long gas barrier laminate that has been wound in the form of a roll, and a method for producing the same.

Solution to Problem

The inventors conducted extensive studies in order to solve the above technical problem. As a result, the inventors found that a long gas barrier laminate including a base, a functional layer, a smoothing layer, and a gas barrier layer, the functional layer being stacked on one side of the base, the smoothing layer and the gas barrier layer being sequentially stacked on the other side of the base, and the coefficient of static friction between the surface of the functional layer that is situated opposite to the base and the surface of the gas barrier layer that is situated opposite to the base being within a specific range, exhibits excellent workability when winding the long gas barrier laminate in the form of a roll, or unwinding the long gas barrier laminate that has been wound in the form of a roll. This finding has led to the completion of the invention.

Several aspects of the invention provide the following gas barrier laminate (see (1) to (7)) and method for producing a gas barrier laminate (see (8) and (9)).

(1) A long gas barrier laminate including a base, a functional layer, a smoothing layer, and a gas barrier layer,
  the functional layer being stacked on one side of the base,
  the smoothing layer and the gas barrier layer being sequentially stacked on the other side of the base, and
  the coefficient of static friction between the surface of the functional layer that is situated opposite to the base and the surface of the gas barrier layer that is situated opposite to the base being 0.35 to 0.80.

(2) The long gas barrier laminate according to (1), wherein the surface of the functional layer that is situated opposite to the base has an arithmetic average roughness (Ra) of 5 nm or more and a total height (Rt) of a roughness profile of 100 nm or more, and the surface of the gas barrier layer that is situated opposite to the base has an arithmetic average roughness (Ra) of 5 nm or less and a total height (Rt) of a roughness profile of 100 nm or less.

(3) The long gas barrier laminate according to (1), wherein the coefficient of static friction between the surface of the functional layer that is situated opposite to the base and the surface of the smoothing layer that is situated opposite to the base is 0.35 to 0.80.

(4) The long gas barrier laminate according to (1), wherein the surface of the smoothing layer that is situated opposite to the base has an arithmetic average roughness (Ra) of 5 nm or less and a total height (Rt) of a roughness profile of 100 nm or less.

(5) The long gas barrier laminate according to (1), wherein the functional layer is a hard coat layer that is formed of a cured product of an activated energy ray-curable resin composition.

(6) The long gas barrier laminate according to (1), wherein the smoothing layer is formed of a cured product of an activated energy ray-curable resin composition.

(7) The long gas barrier laminate according to (1), wherein the gas barrier layer is a layer obtained by subjecting a layer that includes a polysilazane-based compound to a modification treatment.

(8) A method for producing the long gas barrier laminate according to (1), the method including:
  a step (a-I) that forms the smoothing layer on a base resin film while feeding the base resin film in a given direction to obtain a resin film having the smoothing layer, and winds the resin film having the smoothing layer in the form of a roll;
  a step (a-II) that forms the functional layer on the surface of the resin film having the smoothing layer obtained by the step (a-I) while continuously unwinding and feeding the resin film having the smoothing layer that has been wound in the form of a roll in a given direction to obtain a resin film having the functional layer and the smoothing layer, and winds the resin film having the functional layer and the smoothing layer in the form of a roll; and a step (a-III) that forms the gas barrier layer having a coefficient of static friction of 0.35 to 0.80 with respect to the functional layer on the surface of the smoothing layer provided to the resin film having the functional layer and the smoothing layer obtained by the step (a-II) while continuously unwinding and feeding the resin film having the functional layer and the smoothing layer that has been wound in the form of a roll in a given direction to obtain a gas barrier laminate, and winds the gas barrier laminate in the form of a roll.

(9) A method for producing the long gas barrier laminate according to (1), the method including:

a step (b-I) that forms the functional layer on a base resin film while feeding the base resin film in a given direction to obtain a resin film having the functional layer, and winds the resin film having the functional layer in the form of a roll;

a step (b-II) that forms the smoothing layer on the surface of the resin film having the functional layer obtained by the step (b-I) while continuously unwinding and feeding the resin film having the functional layer that has been wound in the form of a roll in a given direction to obtain a resin film having the functional layer and the smoothing layer, and winds the resin film having the functional layer and the smoothing layer in the form of a roll; and a step (b-III) that forms the gas barrier layer having a coefficient of static friction of 0.35 to 0.80 with respect to the functional layer on the surface of the smoothing layer provided to the resin film having the functional layer and the smoothing layer obtained by the step (b-II) while continuously unwinding and feeding the resin film having the functional layer and the smoothing layer that has been wound in the form of a roll in a given direction to obtain a gas barrier laminate, and winds the gas barrier laminate in the form of a roll.

Advantageous Effects of Invention

The aspects of the invention thus provide a long gas barrier laminate that exhibits excellent workability when winding the long gas barrier laminate in the form of a roll, or unwinding the long gas barrier laminate that has been wound in the form of a roll, and a method for producing the same.

DESCRIPTION OF EMBODIMENTS

A long gas barrier laminate and a method for producing a long gas barrier laminate according to the exemplary embodiments of the invention are described in detail below.

1) Long Gas Barrier Laminate

A long gas barrier laminate according to one embodiment of the invention includes a base, a functional layer, a smoothing layer, and a gas barrier layer, the functional layer being stacked on one side of the base, the smoothing layer and the gas barrier layer being sequentially stacked on the other side of the base, and the coefficient of static friction between the surface of the functional layer that is situated opposite to the base and the surface of the gas barrier layer that is situated opposite to the base being 0.35 to 0.80.

(1) Base

The base included in the long gas barrier laminate according to one embodiment of the invention is not particularly limited as long as the base can support the functional layer, the smoothing layer, and the gas barrier layer, and has a long sheet-like or film-like shape.

The term "long" used herein in connection with the base and the like means that the base and the like have a strip-like shape in which the dimension in the longitudinal direction is larger (longer) than the dimension in the widthwise direction (preferably by a factor of 10 or more). Note that the term "long" may be hereinafter appropriately omitted.

The length (i.e., the dimension in the longitudinal direction) of the base is not particularly limited, but is normally 400 to 2,000 m. The width (i.e., the dimension in the widthwise direction) of the base is not particularly limited, but is normally 450 to 1,300 mm, and preferably 530 to 1,280 mm. The thickness of the base is not particularly limited, but is normally 1 to 60 µm, preferably 5 to 50 µm, and more preferably 10 to 30 µm.

Examples of the base include a resin film. Examples of a resin component that is used to form the resin film include a polyimide, a polyamide, a polyamide-imide, a polyphenylene ether, a polyether ketone, a polyether ether ketone, a polyolefin, a polyester, a polycarbonate, a polysulfone, a polyether sulfone, a polyphenylene sulfide, an acrylic-based resin, a cycloolefin-based polymer, an aromatic polymer, and the like.

These resin components may be used either alone or in combination.

Among these, a polyester, a polyamide, a polysulfone, a polyether sulfone, a polyphenylene sulfide, and a cycloolefin-based polymer are preferable due to excellent transparency and versatility. It is more preferable to use a polyester or a cycloolefin-based polymer.

Examples of the polyester include polyethylene terephthalate, polybutylene terephthalate, polyethylene naphthalate, polyarylate, and the like.

Examples of the cycloolefin-based polymer include a norbornene-based polymer, a monocyclic olefin-based polymer, a cyclic conjugated diene-based polymer, a vinyl alicyclic hydrocarbon-based polymer, and a hydrogenated product thereof.

The resin film may include various additives as long as the advantageous effects of the invention are not impaired. Examples of the additives include a UV absorber, an antistatic agent, a stabilizer, an antioxidant, a plasticizer, a lubricant, a filler, a color pigment, and the like. The content of each additive may be appropriately determined taking account of the intended use of the gas barrier laminate.

The resin film may be obtained by preparing a resin composition that includes specific components, and forming the resin composition in the shape of a film. The forming method is not particularly limited. A known method such as a casting method or a melt extrusion method may be used as the forming method.

(2) Functional Layer

Examples of the functional layer included in the gas barrier laminate according to one embodiment of the invention include a hard coat layer, an anti-glare hard coat layer, an antistatic layer, and the like. The hard coat layer has a surface protection function, the anti-glare hard coat layer has an anti-glare-surface protection function, and the antistatic layer has an antistatic-surface protection function. The functional layer may be a UV-absorbing layer, an infrared-absorbing layer, a primer layer, or the like. It is preferable that the hard coat layer have a pencil hardness of H or more.

The hard coat layer exhibits sufficient scratch resistance when the hard coat layer has a pencil hardness of H or more.

It is preferable that the antistatic layer have a surface resistivity of $1\times10^4$ to $1\times10^{11}$ Ω/sq.

Since moderate friction occurs between the functional layer and the smoothing layer and between the functional layer and the gas barrier layer, excellent workability can be achieved when winding the resulting gas barrier laminate in the form of a roll, or unwinding the gas barrier laminate that has been wound in the form of a roll.

Examples of the hard coat layer include a layer that is formed of a cured product of an activated energy ray-curable resin composition.

The term "activated energy ray-curable resin composition" used herein refers to a composition that includes a polymerizable compound, and can be cured by applying activated energy rays.

Examples of the polymerizable compound include a polymerizable prepolymer and a polymerizable monomer.

Examples of the polymerizable prepolymer include a polyester acrylate-based prepolymer obtained by reacting a polyester oligomer that includes a hydroxyl group at each terminal with (meth)acrylic acid, an epoxy acrylate-based prepolymer obtained by reacting a bisphenol-type epoxy resin or a novolac-type epoxy resin having a low molecular weight with (meth)acrylic acid, a urethane acrylate-based prepolymer obtained by reacting a polyurethane oligomer with (meth)acrylic acid, a polyol acrylate-based prepolymer obtained by reacting a polyether polyol with (meth)acrylic acid, and the like.

Examples of the polymerizable monomer include, but are not limited to, a difunctional (meth)acrylate such 1,4-butanediol di(meth)acrylate, 1,6-hexanediol di(meth)acrylate, neopentyl glycol di(meth)acrylate, polyethylene glycol di(meth)acrylate, hydroxypivalic acid neopentyl glycol di(meth)acrylate, dicyclopentanyl di(meth)acrylate, caprolactone-modified dicyclopentenyl di(meth)acrylate, ethylene oxide-modified phosphoric acid di(meth)acrylate, allylated cyclohexyl di(meth)acrylate, and isocyanurate di(meth)acrylate; a trifunctional (meth)acrylate such as trimethylolpropane tri(meth)acrylate, pentaerythritol tri(meth) acrylate, propionic acid-modified dipentaerythritol tri(meth) acrylate, pentaerythritol tri(meth)acrylate, propylene oxide-modified trimethylolpropane tri(meth)acrylate, and tris (acryloxyethyl) isocyanurate; a tetrafunctional or higher functional (meth)acrylate such as propionic acid-modified dipentaerythritol penta(meth)acrylate, dipentaerythritol hexa(meth)acrylate, and caprolactone-modified dipentaerythritol hexa(meth)acrylate; a vinyl compound such as ethylene glycol divinyl ether, pentaerythritol divinyl ether, 1,6-hexanediol divinyl ether, trimethylolpropane divinyl ether, ethylene oxide-modified hydroquinone divinyl ether, ethylene oxide-modified bisphenol A divinyl ether, pentaerythritol trivinyl ether, dipentaerythritol hexavinyl ether, and ditrimethylolpropane polyvinyl ether; and the like.

These polymerizable compounds may be used either alone or in combination.

Note that the term "(meth)acryloyl group" includes an acryloyl group and a methacryloyl group.

The activated energy ray-curable resin composition may include a polymer resin component that does not have reactivity-curability (e.g., acrylic resin). The viscosity of the composition can be adjusted by adding the polymer resin component.

Examples of the activated energy rays include UV rays, electron beams, α-rays, β-rays, γ-rays, and the like. It is preferable to use UV rays as the activated energy rays since UV rays can be generated using a relatively simple device.

When using UV rays as the activated energy rays, it is preferable that the activated energy ray-curable resin composition (i.e., UV-curable resin composition) include a photopolymerization initiator.

The photopolymerization initiator is not particularly limited as long as the photopolymerization initiator can initiate a polymerization reaction upon application of UV rays. Examples of the photopolymerization initiator include a benzoin-based polymerization initiator such as benzoin, benzoin methyl ether, benzoin ethyl ether, benzoin isopropyl ether, benzoin n-butyl ether, and benzoin isobutyl ether; an acetophenone-based polymerization initiator such as acetophenone, 4'-dimethylaminoacetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexyl phenyl ketone, 2-methyl-1-[4-(methylthio)phenyl]-2-morpholinopropan-1-one, and 2-hydroxy-1-{4-[4-(2-hydroxy-2-methylpropionyl)benzyl]phenyl}-2-methypropan-1-one; a benzophenone-based polymerization initiator such as benzophenone, 4-phenylbenzophenone, 4,4'-diethylaminobenzophenone, 4,4'-dichlorobenzophenone; an anthraquinone-based polymerization initiator such as 2-methylanthraquinone, 2-ethylanthraquinone, 2-t-butylanthraquinone, and 2-aminoanthraquinone; a thioxanthone-based polymerization initiator such as 2-methylthioxanthone, 2-ethylthioxanthone, 2-chlorothioxanthone, 2,4-dimethylthioxanthone, and 2,4-diethylthioxanthone; and the like.

The content of the photopolymerization initiator in the activated energy ray-curable resin composition is not particularly limited. The photopolymerization initiator is normally used in a ratio of 0.2 to 30 mass %, and preferably 0.5 to 20 mass %, based on the polymerizable compound.

It is preferable that the activated energy ray-curable resin composition include fine particles (e.g., organic fine particles and inorganic fine particles). It is possible to efficiently control the surface roughness and the anti-glare properties of the hard coat layer by utilizing the activated energy ray-curable resin composition that includes fine particles.

Examples of the organic fine particles include fine particles formed of a polystyrene-based resin, fine particles formed of a styrene-acrylic-based copolymer resin, fine particles formed of an acrylic-based resin, fine particles formed of an amino-based resin, fine particles formed of a divinylbenzene-based resin, fine particles formed of a silicone-based resin, fine particles formed of a urethane-based resin, fine particles formed of a melamine-based resin, fine particles formed of a urea resin, fine particles formed of a phenol-based resin, fine particles formed of a benzoguanamine-based resin, fine particles formed of a xylene-based resin, fine particles formed of a polycarbonate-based resin, fine particles formed of a polyethylene-based resin, fine particles formed of a polyvinyl chloride-based resin, and the like. Among these, silicone fine particle formed of a silicone resin are preferable.

Examples of the inorganic fine particles include silica particles, metal oxide particles, alkyl silicate particles, and the like.

Examples of the silica particles include colloidal silica particles, hollow silica particles, and the like.

Examples of the metal oxide particles include titanium oxide particles, zinc oxide particles, zirconium oxide particles, tantalum oxide particles, indium oxide particles, hafnium oxide particles, tin oxide particles, niobium oxide particles, and the like.

Examples of the alkyl silicate particles include particles of an alkyl silicate represented by $R^a$—O{—[Si(OR$^b$)$_2$]—

O-$\}_n$-R$^a$ (wherein R$^a$ and R$^b$ are an alkyl group having 1 to 10 carbon atoms, and n is an integer equal to or larger than 1).

It is preferable to use silica particles or alkyl silicate particles due to excellent compatibility with the curable component and a capability to efficiently control the refractive index of an optical adjustment layer.

These fine particles may be used either alone or in combination.

The shape of the fine particles is not particularly limited. For example, fine particles having an arbitrary shape (e.g., amorphous shape or spherical shape) may be used.

The average particle size of the fine particles is normally 0.001 to 10 µm, and preferably 0.005 to 5 µm. The average particle size of the fine particles may be measured using a laser diffraction/scattering method.

When the activated energy ray-curable resin composition includes the fine particles, the content of the fine particles in the activated energy ray-curable resin composition is preferably 0.1 to 170 mass %, and more preferably 1 to 50 mass %, based on the solid content in the activated energy ray-curable resin composition.

It is preferable that the activated energy ray-curable resin composition include a leveling agent. It is possible to efficiently control the surface roughness of the hard coat layer by utilizing the activated energy ray-curable resin composition that includes a leveling agent.

Examples of the leveling agent include a siloxane-based compound. It is preferable to use a compound that includes a dialkylsiloxane skeleton (e.g., polydimethylsiloxane and a derivative thereof).

When the activated energy ray-curable resin composition includes the leveling agent, the content of the leveling agent in the activated energy ray-curable resin composition is preferably 0.01 to 10 mass %, and more preferably 0.05 to 5 mass %, based on the solid content in the activated energy ray-curable resin composition.

The activated energy ray-curable resin composition may include an additional component as long as the advantageous effects of the invention are not impaired.

Examples of the additional component include an antistatic agent, a stabilizer, an antioxidant, a plasticizer, a lubricant, a color pigment, and the like. The content of each additional component may be appropriately determined taking account of the intended use of the gas barrier laminate.

The hard coat layer may be formed using an arbitrary method. For example, the hard coat layer that is formed of a cured product of the activated energy ray-curable resin composition may be formed by preparing a coating liquid that includes the activated energy ray-curable resin composition and an optional solvent, applying the coating liquid to the base using a known method, and curing the resulting film. The film may optionally be dried before curing the film.

Examples of the solvent used to prepare the coating liquid include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like. The solvents may be used either alone or in combination.

Examples of the coating method include a bar coating method, a spin coating method, a dipping method, a roll coating method, a gravure coating method, a knife coating method, an air knife coating method, a roll knife coating method, a die coating method, a screen printing method, a spray coating method, a gravure offset method, and the like.

The film may be dried using a known drying method such as a hot-air drying method, a heat roll drying method, or an infrared irradiation method. The drying temperature is normally 60 to 130° C. The drying time is normally several seconds to several tens of minutes.

The film may be cured by applying activated energy rays to the film.

Examples of the activated energy rays include UV rays, electron beams, α-rays, β-rays, γ-rays, and the like. It is preferable to use electron beams or UV rays (more preferably UV rays) as the activated energy rays since electron beams and UV rays can be generated using a relatively simple device.

When using UV rays as the activated energy rays, an ultra-high-pressure mercury lamp, a high-pressure mercury lamp, a low-pressure mercury lamp, a carbon arc, a black light lamp, a metal halide lamp, or the like may be used as the UV source. The UV dose is not particularly limited, but is normally 100 to 1,000 mJ/cm$^2$. The irradiation time is normally several seconds to several hours, and the irradiation temperature is normally room temperature to 100° C.

The thickness of the hard coat layer is normally 20 µm or less, preferably 0.5 to 20 µm, and more preferably 1.0 to 10 µm.

The antistatic layer is not particularly limited, but is preferably formed of an antistatic layer-forming composition that includes a condensation polymer of either or both of a metal alkoxide and a partially hydrolyzed metal alkoxide. It is possible to provide the gas barrier laminate with antistatic performance by providing the antistatic layer.

A metal alkoxide is normally represented by M(OR)$_n$. The metal M is not particularly limited. Examples of the metal M include an alkali metal such as lithium, sodium, and potassium; magnesium; an alkaline-earth metal such as calcium, strontium, and barium; an element that belongs to Group 3 in the periodic table, such as scandium and yttrium; an element that belongs to Group 4 in the periodic table, such as titanium, zirconium, and hafnium; an element that belongs to Group 5 in the periodic table, such as vanadium, niobium, and tantalum; an element that belongs to Group 6 in the periodic table, such as molybdenum and tungsten; an element that belongs to Group 8 in the periodic table, such as iron; an element that belongs to Group 12 in the periodic table, such as zinc; an element that belongs to Group 13 in the periodic table, such as boron, aluminum, gallium, and indium; an element that belongs to Group 14 in the periodic table, such as silicon, germanium, tin, and lead; an element that belongs to Group 15 in the periodic table, such as phosphorus, antimony, and bismuth; a lanthanoid such as lanthanum; and the like. Among these, silicon is most preferable since silicon exhibits high antistatic performance and high adhesion to the smoothing layer. Specifically, a tetraalkoxysilane is most preferable as the metal alkoxide. One metal alkoxide may be used alone, or a plurality of metal alkoxides may be used in combination.

R is an alkyl group (preferably an alkyl group having 1 to 10 carbon atoms, and more preferably an alkyl group having 1 to 5 carbon atoms). When a plurality of alkyl groups are included in the metal alkoxide, the plurality of alkyl groups may be identical to each other, or may differ from each other. n is an integer determined by the valence of the metal M. n is normally an integer from 1 to 5.

The metal alkoxide may be partially hydrolyzed in advance. It is also possible to use the metal alkoxide and the partially hydrolyzed metal alkoxide in combination.

It is preferable that the antistatic layer-forming composition include fine particles (e.g., organic fine particles and inorganic fine particles). It is possible to efficiently control the surface roughness of the antistatic layer by utilizing the antistatic layer-forming composition that includes fine particles. Examples of the fine particles include those mentioned above in connection with the hard coat layer.

The antistatic layer may be formed using an arbitrary method. It is preferable to form the antistatic layer by applying a coating liquid that includes either or both of a metal alkoxide and a partially hydrolyzed metal alkoxide.

The coating liquid may be applied using an ordinary method. For example, the coating liquid may be applied using a gravure coating method, a bar coating method, a spray coating method, a spin coating method, or the like. Note that the antistatic layer may be formed by applying a solution prepared by dissolving either or both of a metal alkoxide and a partially hydrolyzed metal alkoxide in a solvent. In this case, an organic solvent may suitably be used as the solvent. The organic solvent is not particularly limited. For example, an alcohol solvent (e.g., ethanol and isopropanol) or a ketone solvent (e.g., methyl ethyl ketone) may be used as the organic solvent.

Either or both of a metal alkoxide and a partially hydrolyzed metal alkoxide form a condensation polymer through a hydrolysis reaction and a polycondensation reaction to form the antistatic layer. An acid catalyst such as hydrochloric acid or nitric acid may be used (added) to promote the hydrolysis reaction.

It is preferable to perform a heat treatment after applying either or both of a metal alkoxide and a partially hydrolyzed metal alkoxide in order to effect drying, or promote the polycondensation reaction of either or both of a metal alkoxide and a partially hydrolyzed metal alkoxide. The heating conditions are not particularly limited as long as the above object can be achieved. The heat treatment is normally performed at 40 to 120° C. for about 20 seconds to about 5 minutes. It is more preferable to perform the heat treatment at 60 to 110° C. for about 30 seconds to about 2 minutes in order to improve productivity and prevent the occurrence of wrinkles due to thermal shrinkage.

The thickness of the antistatic layer is normally 20 μm or less, preferably 0.05 to 10 μm, and more preferably 0.08 to 3 μm.

The arithmetic average roughness (Ra) of the surface (that is situated opposite to the base) of the functional layer is preferably 5 nm or more, more preferably 5 to 20 nm, and still more preferably 5 to 10 nm.

The total height (Rt) of the roughness profile of the surface of the functional layer is preferably 100 nm or more, more preferably 100 to 1,000 nm, and still more preferably 100 to 800 nm.

When the surface roughness of the functional layer is within the above ranges, it is possible to efficiently obtain a gas barrier laminate having the frictional properties described later.

Note that the arithmetic average roughness (Ra) and the total height (Rt) of the roughness profile of the surface of the functional layer and the surface of other layers may be measured using an optical interference microscope (observation target area: 500×500 μm).

(3) Smoothing Layer

The smoothing layer included in the gas barrier laminate according to one embodiment of the invention reduces the degree of unevenness of the surface of the base, and improves the interlayer adhesion of the gas barrier laminate.

Examples of the smoothing layer include a layer that is formed of a cured product of an activated energy ray-curable resin composition.

Examples of the activated energy ray-curable resin composition include those mentioned above in connection with the activated energy ray-curable resin composition for forming the hard coat layer.

Since it is preferable that the smoothing layer be highly smooth and flat as compared with the functional layer, it is preferable that the activated energy ray-curable resin composition for forming the smoothing layer does not include a component (e.g., fine particles) that roughens the surface of the smoothing layer.

The smoothing layer may be formed using a method similar to the method for forming the hard coat layer.

The thickness of the smoothing layer is normally 20 μm or less, preferably 0.1 to 20 μm, and more preferably 0.5 to 10 μm.

The arithmetic average roughness (Ra) of the surface (that is situated opposite to the base) of the smoothing layer is preferably 5 nm or less, more preferably 0.1 to 5 nm, still more preferably 0.1 to 4 nm, and particularly preferably 1 to 4 nm.

The total height (Rt) of the roughness profile of the surface of the smoothing layer is preferably 100 nm or less, more preferably 1 to 100 nm, still more preferably 20 to 80 nm, and particularly preferably 30 to 65 nm.

When the surface roughness of the smoothing layer is within the above ranges, it is possible to improve the interlayer adhesion of the gas barrier laminate, and efficiently obtain a gas barrier laminate having the frictional properties described later.

(4) Gas Barrier Layer

The gas barrier layer included in the gas barrier laminate according to one embodiment of the invention is a layer that has a capability to suppress transmission of gas (e.g., oxygen and water vapor) (gas barrier capability).

Examples of the gas barrier layer include an inorganic deposited film and a layer obtained by subjecting a layer that includes a polymer (hereinafter may be referred to as "polymer layer") to a modification treatment. In this case, the term "gas barrier layer" does not refer to only an area that has been modified by the modification treatment (e.g., ion implantation treatment), but refers to the entire polymer layer including an area that has been modified by the modification treatment.

Examples of the inorganic deposited film include a film obtained by depositing an inorganic compound (inorganic compound deposited film), and a film obtained by depositing a metal (metal deposited film).

Examples of a raw material for forming the inorganic compound deposited film include an inorganic oxide such as silicon oxide, aluminum oxide, magnesium oxide, zinc oxide, indium oxide, and tin oxide; an inorganic nitride such as silicon nitride, aluminum nitride, and titanium nitride; an inorganic carbide; an inorganic sulfide; an inorganic oxynitride such as silicon oxynitride; an inorganic oxycarbide; an inorganic carbonitride; an inorganic oxycarbonitride; and the like.

Examples of a raw material for forming the metal deposited film include aluminum, magnesium, zinc, tin, and the like.

These materials may be used either alone or in combination.

An inorganic deposited film that is formed using an inorganic oxide, an inorganic nitride, or a metal as the raw material is preferable from the viewpoint of gas barrier capability. An inorganic deposited film that is formed using an inorganic oxide or an inorganic nitride as the raw material is preferable from the viewpoint of transparency.

The inorganic deposited film may be formed using a physical vapor deposition (PVD) method such as a vacuum deposition method, a sputtering method, or an ion plating method, or a chemical vapor deposition (CVD) method such as a thermal CVD method, a plasma CVD method, or a photo-CVD method, for example.

The thickness of the inorganic deposited film may be selected taking account of the inorganic compound used as the raw material, but is preferably 50 to 300 nm, and more preferably 50 to 200 nm, from the viewpoint of gas barrier capability and handling capability.

Examples of the polymer that is used when forming the gas barrier layer by subjecting the polymer layer to the modification treatment, include a silicon-containing polymer, a polyimide, a polyamide, a polyamide-imide, a polyphenylene ether, a polyether ketone, a polyether ether ketone, a polyolefin, a polyester, a polycarbonate, a polysulfone, a polyether sulfone, a polyphenylene sulfide, a polyallylate, an acrylic-based resin, a cycloolefin-based polymer, an aromatic polymer, and the like.

These polymers may be used either alone or in combination.

It is preferable to use a silicon-containing polymer as the polymer since a gas barrier layer that exhibits a better gas barrier capability can be formed. Examples of the silicon-containing polymer include a polysilazane-based compound, a polycarbosilane-based compound, a polysilane-based compound, a polyorganosiloxane-based compound, and the like. Among these, a polysilazane-based compound is preferable since a gas barrier layer that exhibits an excellent gas barrier capability can be formed even when the thickness of the gas barrier layer is reduced. A layer (silicon oxynitride layer) that includes oxygen, nitrogen, and silicon as the main constituent atoms can be formed by subjecting a layer that includes a polysilazane-based compound to the modification treatment.

The term "polysilazane-based compound" used herein refers to a polymer compound that includes a repeating unit that includes an —Si—N— bond (silazane bond) in the molecule. The polysilazane-based compound is preferably a compound that includes a repeating unit represented by the following formula (1).

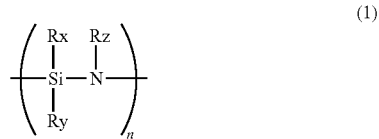

(1)

The number average molecular weight of the polysilazane-based compound is not particularly limited, but is preferably 100 to 50,000.

n in the formula (1) is an arbitrary natural number.

Rx, Ry, and Rz are independently a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the alkyl group (that is substituted or unsubstituted) include an alkyl group having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the cycloalkyl group (that is substituted or unsubstituted) include a cycloalkyl group having 3 to 10 carbon atoms (e.g., cyclobutyl group, cyclopentyl group, cyclohexyl group, and cycloheptyl group).

Examples of the alkenyl group (that is substituted or unsubstituted) include an alkenyl group having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group, the cycloalkyl group, and the alkenyl group include a halogen atom such as a fluorine atom, a chlorine atom, a bromine atom, and an iodine atom; a hydroxyl group; a thiol group; an epoxy group; a glycidoxy group; a (meth)acryloyloxy group; a substituted or unsubstituted aryl group such as a phenyl group, a 4-methylphenyl group, and a 4-chlorophenyl group; and the like.

Examples of the aryl group (that is substituted or unsubstituted) include an aryl group having 6 to 10 carbon atoms (e.g., phenyl group, 1-naphthyl group, and 2-naphthyl group).

Examples of a substituent that may substitute the aryl group include a halogen atom such as a fluorine atom, a chlorine atom, a bromine atom, and an iodine atom; an alkyl group having 1 to 6 carbon atoms, such as a methyl group and an ethyl group; an alkoxy group having 1 to 6 carbon atoms, such as a methoxy group and an ethoxy group; a nitro group; a cyano group; a hydroxyl group; a thiol group; an epoxy group; a glycidoxy group; a (meth)acryloyloxy group; a substituted or unsubstituted aryl group such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a methyldiethylsilyl group, a dimethylsilyl group, a diethylsilyl group, a methylsilyl group, an ethylsilyl group, and the like.

A hydrogen atom, an alkyl group having 1 to 6 carbon atoms, and a phenyl group are preferable as Rx, Ry, and Rz, and a hydrogen atom is particularly preferable as Rx, Ry, and Rz.

The polysilazane-based compound that includes the repeating unit represented by the formula (1) may be an inorganic polysilazane in which all of Rx, Ry, and Rz are a hydrogen atom, or an organic polysilazane in which at least one of Rx, Ry, and Rz is not a hydrogen atom.

A modified polysilazane may be used as the polysilazane-based compound. For example, the modified polysilazane disclosed in JP-A-62-195024, JP-A-2-84437, JP-A-63-81122, JP-A-1-138108, JP-A-2-175726, JP-A-5-238827, JP-A-6-122852, JP-A-6-306329, JP-A-6-299118, JP-A-9-31333, JP-A-5-345826, JP-A-4-63833, or the like may be used as the polysilazane-based compound.

Among these, a perhydropolysilazane in which all of Rx, Ry, and Rz are a hydrogen atom is preferable as the polysilazane-based compound from the viewpoint of availability and a capability to form an ion-implanted layer that exhibits an excellent gas barrier capability.

A product commercially available as a glass coating material or the like may be used directly as the polysilazane-based compound.

These polysilazane-based compounds may be used either alone or in combination.

The polymer layer may include an additional component other than the polymer as long as the object of the invention is not impaired. Examples of the additional component include a curing agent, an aging preventive, a light stabilizer, a flame retardant, and the like.

The content of the polymer in the polymer layer is preferably 50 mass % or more, and more preferably 70 mass % or more, since a gas barrier layer that exhibits a better gas barrier capability can be obtained.

The thickness of the polymer layer is not particularly limited, but is preferably 50 to 300 nm, and more preferably 50 to 200 nm.

A gas barrier laminate that exhibits a sufficient gas barrier capability can be obtained even when the polymer layer has a thickness at a nanometer level.

The polymer layer may be formed using an arbitrary method. For example, the polymer layer may be formed by preparing a polymer layer-forming solution that includes at least one polymer, an optional additional component, a solvent, and the like, applying the polymer layer-forming solution using a known method, and drying the resulting film.

Examples of the solvent used to prepare the polymer layer-forming solution include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like.

These solvents may be used either alone or in combination.

The polymer layer-forming solution may be applied using a bar coating method, a spin coating method, a dipping method, a roll coating method, a gravure coating method, a knife coating method, an air knife coating method, a roll knife coating method, a die coating method, a screen printing method, a spray coating method, a gravure offset method, or the like.

The film formed by applying the polymer layer-forming solution may be dried using a known drying method such as a hot-air drying method, a heat roll drying method, or an infrared irradiation method. The heating temperature is normally 60 to 130° C. The heating time is normally several seconds to several tens of minutes.

Examples of the modification treatment used for the polymer layer include an ion implantation treatment, a plasma treatment, a UV irradiation treatment, a heat treatment, and the like.

The ion implantation treatment implants ions into the polymer layer to modify the polymer layer (as described layer).

The plasma treatment exposes the polymer layer to plasma to modify the polymer layer. The plasma treatment may be implemented using the method disclosed in JP-A-2012-106421, for example.

The UV irradiation treatment applies UV rays to the polymer layer to modify the polymer layer. The UV irradiation treatment may be implemented using the method disclosed in JP-A-2013-226757, for example.

It is preferable to use the ion implantation treatment since the inner area of the polymer layer can also be efficiently modified without roughening the surface of the polymer layer, and a gas barrier layer that exhibits a better gas barrier capability can be formed.

Examples of the ions that are implanted into the polymer layer include ions of a rare gas such as argon, helium, neon, krypton, and xenon; ions of fluorocarbon, hydrogen, nitrogen, oxygen, carbon dioxide, chlorine, fluorine, and sulfur; ions of alkane-based gases such as methane and ethane; ions of alkene-based gases such as ethylene and propylene; ions of alkadiene-based gases such as pentadiene and butadiene; ions of alkyne-based gases such as acetylene; ions of aromatic hydrocarbon-based gases such as benzene and toluene; ions of cycloalkane-based gases such as cyclopropane; ions of cycloalkene-based gases such as cyclopentene; ions of a metal; ions of an organosilicon compound; and the like.

These ions may be used either alone or in combination.

It is preferable to use ions of a rare gas such as argon, helium, neon, krypton, or xenon due to ease of ion implantation and an ability to form a gas barrier layer that exhibits better gas barrier capability.

The ion implantation dose may be appropriately determined taking account of the intended use of the gas barrier laminate (e.g., desired gas barrier capability and transparency), and the like.

The ions may be implanted using a method that applies ions (ion beams) accelerated by applying an electric field, or a method that implants ions present in a plasma (plasma ion implantation method), for example. It is preferable to use the plasma ion implantation method since the desired barrier layer can be easily obtained.

The plasma ion implantation method may be implemented by generating a plasma in an atmosphere including a plasma-generating gas (e.g., rare gas), and implanting ions (cations) present in the plasma into the surface area of the polymer layer by applying a negative high-voltage pulse to the polymer layer, for example.

The thickness of the ion implantation target area may be controlled by adjusting the implantation conditions (e.g., type of ions, applied voltage, and implantation time), and may be determined taking account of the thickness of the polymer layer, the intended use of the laminate, and the like. The thickness of the ion implantation target area is normally 10 to 300 nm.

(4) Long Gas Barrier Laminate

The long gas barrier laminate according to one embodiment of the invention includes the base, the functional layer, the smoothing layer, and the gas barrier layer, the functional layer being stacked on one side of the base, the smoothing layer and the gas barrier layer being sequentially stacked on the other side of the base, and the coefficient of static friction between the surface of the functional layer that is situated opposite to the base and the surface of the gas barrier layer that is situated opposite to the base being 0.35 to 0.80.

The coefficient of static friction between the surface of the functional layer that is situated opposite to the base and the surface of the gas barrier layer that is situated opposite to the base is 0.35 to 0.80, and preferably 0.40 to 0.75.

When the coefficient of static friction between the functional layer and the gas barrier layer is within the above range, blocking, air entrainment, and the like rarely occur when winding the long gas barrier laminate according to one embodiment of the invention in the form of a roll, or unwinding the long gas barrier laminate according to one embodiment of the invention that has been wound in the form of a roll.

The long gas barrier laminate according to one embodiment of the invention is preferably characterized in that the coefficient of static friction between the surface of the functional layer that is situated opposite to the base and the surface of the smoothing layer that is situated opposite to the base is 0.35 to 0.80, and preferably 0.40 to 0.75. When the coefficient of static friction between the functional layer and the smoothing layer is within the above range, blocking, air entrainment, and the like rarely occur when winding the resin film having the functional layer and the smoothing layer (that is an intermediate for producing the long gas barrier laminate according to one embodiment of the invention) in the form of a roll, or unwinding the resin film having the functional layer and the smoothing layer that has been wound in the form of a roll.

The coefficient of static friction of the functional layer, the smoothing layer, and the gas barrier layer may be measured in accordance with JIS K 7125.

The long gas barrier laminate according to one embodiment of the invention may have a layer configuration in which the functional layer, the base, the smoothing layer, and the gas barrier layer are sequentially stacked.

The long gas barrier laminate according to one embodiment of the invention may include a layer other than the functional layer, the base, the smoothing layer, and the gas barrier layer.

Examples of a layer other than the base, the smoothing layer, and the gas barrier layer include a conductive layer, an impact-absorbing layer, a pressure-sensitive adhesive layer, a casting sheet, and the like. Note that the casting sheet protects the laminate during storage, transportation, and the like. The casting sheet is removed before the laminate is used.

The gas barrier laminate according to one embodiment of the invention may be produced using the methods described later.

The thickness of the gas barrier laminate according to one embodiment of the invention is not particularly limited, but is preferably 5 to 100 µm, more preferably 10 to 50 µm, and still more preferably 20 to 40 µm.

The gas barrier laminate according to one embodiment of the invention preferably has a water vapor transmission rate at a temperature of 40° C. and a relative humidity of 90% of 0.1 g/(m²·day) or less, more preferably 0.05 g/(m²·day) or less, and still more preferably 0.03 g/(m²·day) or less. The lower limit of the water vapor transmission rate of the gas barrier laminate according to one embodiment of the invention is not particularly limited, and is preferably as small as possible. The lower limit of the water vapor transmission rate of the gas barrier laminate according to one embodiment of the invention is normally 0.001 g/(m²·day) or more.

The water vapor transmission rate may be measured using the method described later in connection with the examples.

Since the gas barrier laminate according to one embodiment of the invention exhibits an excellent gas barrier capability, the gas barrier laminate according to one embodiment of the invention may suitably be used as an electronic device member.

Examples of the electronic device include a liquid crystal display, an organic EL display, an inorganic EL display, electronic paper, a solar cell, and the like.

2) Method for Producing Long Gas Barrier Laminate

A method for producing a long gas barrier laminate according to one embodiment of the invention includes the following steps (a-I) to (a-III) (hereinafter referred to as "production method (a)"), or includes the following steps (b-I) to (b-III) (hereinafter referred to as "production method (b)").

Production Method (a)

Step (a-I) that forms the smoothing layer on a base resin film while feeding the base resin film in a given direction to obtain a resin film having the smoothing layer, and winds the resin film having the smoothing layer in the form of a roll Step (a-II) that forms the functional layer on the surface of the resin film having the smoothing layer obtained by the step (a-I) while continuously unwinding and feeding the resin film having the smoothing layer that has been wound in the form of a roll in a given direction to obtain a resin film having the functional layer and the smoothing layer, and winds the resin film having the functional layer and the smoothing layer in the form of a roll Step (a-III) that forms the gas barrier layer having a coefficient of static friction of 0.35 to 0.80 with respect to the functional layer on the surface of the smoothing layer provided to the resin film having the functional layer and the smoothing layer obtained by the step (a-II) while continuously unwinding and feeding the resin film having the functional layer and the smoothing layer that has been wound in the form of a roll in a given direction to obtain a gas barrier laminate, and winds the gas barrier laminate in the form of a roll In the step (a-I), the smoothing layer is formed on the base resin film while feeding the base resin film in a given direction to obtain the resin film having the smoothing layer, and the resin film having the smoothing layer is wound in the form of a roll.

Examples of the base resin film include those mentioned above, and the smoothing layer may be formed as described above.

The resin film may be fed, and the resin film having the smoothing layer may be wound by applying a known method for producing a laminate film that utilizes a roll-to-roll method.

In the step (a-II), the functional layer is formed on the surface of the resin film having the smoothing layer obtained by the step (a-I) while continuously unwinding and feeding the resin film having the smoothing layer that has been wound in the form of a roll in a given direction to obtain the resin film having the functional layer and the smoothing layer, and the resin film having the functional layer and the smoothing layer is wound in the form of a roll.

The coefficient of static friction between the surface of the smoothing layer that is situated opposite to the base and the surface of the functional layer (formed by the step (a-II)) that is situated opposite to the base is preferably 0.35 to 0.80, and more preferably 0.40 to 0.75. When the coefficient of static friction between the functional layer and the smoothing layer is within the above range, blocking, air entrainment, and the like rarely occur when winding the resin film having the functional layer and the smoothing layer (that is an intermediate for producing the long gas barrier laminate) in the form of a roll, or unwinding the resin film having the functional layer and the smoothing layer that has been wound in the form of a roll.

The functional layer may be formed as described above.

The resin film having the smoothing layer (that has been wound in the form of a roll) may be unwound and fed, and the resin film having the functional layer and the smoothing layer may be wound, by applying a known method for producing a laminate film that utilizes a roll-to-roll method.

In the step (a-III), the gas barrier layer having a coefficient of static friction of 0.35 to 0.80 with respect to the functional layer is formed on the surface of the smoothing layer provided to the resin film having the functional layer and the smoothing layer obtained by the step (a-II) while continuously unwinding and feeding the resin film having the functional layer and the smoothing layer that has been wound in the form of a roll in a given direction to obtain the gas barrier laminate, and the gas barrier laminate is wound in the form of a roll.

The gas barrier layer formed on the smoothing layer normally exhibits excellent smoothness and flatness. Therefore, blocking, air entrainment, and the like easily occur when winding the gas barrier laminate including such a gas barrier layer in the form of a roll, or unwinding the gas barrier laminate including such a gas barrier layer that has been wound in the form of a roll.

According to one embodiment of the invention, it is possible to solve these problems by controlling the friction coefficient between the functional layer and the gas barrier layer.

The gas barrier layer may be formed as described above.

The resin film having the functional layer and the smoothing layer (that has been wound in the form of a roll) may be unwound and fed, and the gas barrier laminate may be wound, by applying a known method for producing a laminate film that utilizes a roll-to-roll method.

Production Method (b)

Step (b-I) that forms the functional layer on a base resin film while feeding the base resin film in a given direction to obtain a resin film having the functional layer, and winds the resin film having the functional layer in the form of a roll Step (b-II) that forms the smoothing layer on the surface of the resin film having the functional layer obtained by the step (b-I) while continuously unwinding and feeding the resin film having the functional layer that has been wound in the form of a roll in a given direction to obtain a resin film having the functional layer and the smoothing layer, and winds the resin film having the functional layer and the smoothing layer in the form of a roll Step (b-III) that forms the gas barrier layer having a coefficient of static friction of 0.35 to 0.80 with respect to the functional layer on the surface of the smoothing layer provided to the resin film having the functional layer and the smoothing layer obtained by the step (b-II) while continuously unwinding and feeding the resin film having the functional layer and the smoothing layer that has been wound in the form of a roll in a given direction to obtain a gas barrier laminate, and winds the gas barrier laminate in the form of a roll In the step (b-I), the functional layer is formed on the base resin film while feeding the base resin film in a given direction to obtain the resin film having the functional layer, and the resin film having the functional layer is wound in the form of a roll.

The step (b-I) is the same as the step (a-I), except that the functional layer is formed instead of the smoothing layer.

In the step (b-II), the smoothing layer is formed on the surface of the resin film having the functional layer obtained by the step (b-I) while continuously unwinding and feeding the resin film having the functional layer that has been wound in the form of a roll in a given direction to obtain the resin film having the functional layer and the smoothing layer, and the resin film having the functional layer and the smoothing layer is wound in the form of a roll.

The step (b-II) is the same as the step (a-II), except that the smoothing layer is formed instead of the functional layer.

The coefficient of static friction between the surface of the functional layer that is situated opposite to the base and the surface of the smoothing layer (formed by the step (b-II)) that is situated opposite to the base is preferably 0.35 to 0.80, and more preferably 0.40 to 0.75. When the coefficient of static friction between the functional layer and the smoothing layer is within the above range, blocking, air entrainment, and the like rarely occur when winding the resin film having the functional layer and the smoothing layer (that is an intermediate for producing the long gas barrier laminate) in the form of a roll, or unwinding the resin film having the functional layer and the smoothing layer that has been wound in the form of a roll.

In the step (b-III), the gas barrier layer having a coefficient of static friction of 0.35 to 0.80 with respect to the functional layer is formed on the surface of the smoothing layer provided to the resin film having the functional layer and the smoothing layer obtained by the step (b-II) while continuously unwinding and feeding the resin film having the functional layer and the smoothing layer that has been wound in the form of a roll in a given direction to obtain the gas barrier laminate, and the gas barrier laminate is wound in the form of a roll.

The step (b-III) is the same as the step (a-III).

The production method (production method (a) or production method (b)) can efficiently produce the long gas barrier laminate according to one embodiment of the invention.

EXAMPLES

The invention is further described below by way of examples. Note that the invention is not limited to the following examples.

The units "parts" and "%" used in connection with the examples respectively refer to "parts by mass" and "mass %" unless otherwise indicated.

Measurement of Thickness of Each Layer of Gas Barrier Laminate

The thickness of each layer of the gas barrier laminate was measured using a stylus profilometer ("XP-1" manufactured by Ambios Technology Inc.).

Smoothness-Flatness of Each Layer

The smoothness-flatness of each layer of the gas barrier laminate or the production intermediate was evaluated by observing each layer using an optical interference microscope ("NT1100" manufactured by Veeco) (observation target area: 250,000 $\mu m^2$ (500×500 $\mu m$)), and calculating the arithmetic average roughness (Ra) and the total height (Rt) of the roughness profile.

Coefficient of Static Friction

The coefficient of static friction between the surface of the functional layer situated opposite to the base and the surface of the smoothing layer situated opposite to the base of the gas barrier laminate (see "Coefficient of static friction 1" in Table 1), and the coefficient of static friction between the surface of the functional layer situated opposite to the base and the surface of the smoothing layer situated opposite to the base of the resin film having the functional layer and the smoothing layer (that was used to produce the gas barrier laminate) (see "Coefficient of static friction 2" in Table 1), were measured in accordance with JIS K 7125 in a state in which two gas barrier laminates or two resin films were stacked so that the measurement target layers were situated opposite to each other.

Evaluation of Winding Capability

The long gas barrier laminates 1 to 5 obtained in Examples 1 to 3 and Comparative Examples 1 and 2 were wound in the form of a roll, and the winding capability was evaluated in accordance with the following standard. The evaluation results are shown in Table 1.

Good: Blocking and air entrainment did not occur.

Bad: At least either blocking or air entrainment occurred.

Pencil Hardness

The pencil hardness of the surface of the functional layer included in the gas barrier laminate was measured in accordance with JIS K 5600-5-4 ("Pencil method") using a pencil hardness tester ("NP" manufactured by Toyo Seiki Seisakusho, Ltd.).

Surface Resistivity

The surface resistivity of the functional layer included in the gas barrier laminate was measured using parallel electrodes connected to a digital electrometer (manufactured by Advantest Corporation).

Anti-Glare Properties

The gas barrier laminate was placed on a black plate so that the functional layer was positioned on the upper side.

A three-wavelength fluorescent lamp was turned on at a position above the functional layer so that light was reflected by the functional layer, and the anti-glare properties were evaluated in accordance with the following standard. The results are shown in Table 1.

Good: The contour of the fluorescent lamp blurred due to reflection by the functional layer.

Bad: The contour of the fluorescent lamp did not blur due to reflection by the functional layer.

Production Example 1

20 parts of dipentaerythritol hexaacrylate ("A-DPH" manufactured by Shin-Nakamura Chemical Co., Ltd.) was dissolved in 100 parts of methyl isobutyl ketone to prepare a solution, and 3 parts of a photopolymerization initiator ("IRGACURE 127" manufactured by BASF) was added to the solution to prepare a smoothing layer-forming solution.

Production Example 2

The smoothing layer-forming solution obtained in Production Example 1 was applied to a polyethylene terephthalate film ("PET25 Tetoron HPE" manufactured by Teijin DuPont Films Japan Limited, thickness: 25 µm) (hereinafter referred to as "resin film (1)") using a bar coating method while unwinding and feeding the resin film (1) that had been wound in the form of a roll, and the resulting film was heated (dried) at 70° C. for 1 minute. UV rays were applied to the film (high-pressure mercury lamp, line speed: 20 m/min, cumulative dose: 100 mJ/cm$^2$, peak intensity: 1.466 W, pass count: 2) using a UV ray irradiation line to form a smoothing layer (thickness: 1 µm), and the resulting resin film having the smoothing layer was wound in the form of a roll.

Production Example 3

100 parts of a photopolymerization initiator-containing urethane-based hard coat material ("Beamset 575CB" manufactured by Arakawa Chemical Industries, Ltd., solid content: 100%), 5 parts of spherical silicone bead fine particles ("Tospearl 130" manufactured by Momentive Performance Materials Inc., average particle size: 3.0 µm, solid content: 100%), 61.6 parts of ethyl cellosolve, and 61.6 parts of isobutanol were homogenously mixed to prepare a hard coat layer-forming solution (1) having a solid content of 46%.

The hard coat layer-forming solution (1) was applied to the resin film (provided with the smoothing layer) obtained in Production Example 2 using a bar coating method while unwinding and feeding the resin film that had been wound in the form of a roll, and the resulting film was heated (dried) at 70° C. for 1 minute. UV rays were applied to the film (high-pressure mercury lamp, line speed: 20 m/min, cumulative dose: 100 mJ/cm$^2$, peak intensity: 1.466 W, pass count: 2) using a UV ray irradiation line to form a hard coat layer A (thickness: 2 µm), and the resulting resin film (1) provided with the hard coat layer A and the smoothing layer (hard coat layer A/resin film/smoothing layer) was wound in the form of a roll.

Production Example 4

100 parts of a silicate coating liquid (i.e., a compound obtained by subjecting tetraethoxysilane to hydrolysis and dehydration-condensation) ("Colcoat N103-X" manufactured by Colcoat Co., Ltd., solid content: 2%) and 0.1 parts of spherical silicone bead fine particles ("Tospearl 130" manufactured by Momentive Performance Materials Inc., average particle size: 3.0 µm, solid content: 100%) were homogenously mixed to prepare an antistatic layer-forming solution (2) having a solid content of 2%.

The antistatic layer-forming solution (2) was applied to the resin film (provided with the smoothing layer) obtained in Production Example 2 using a bar coating method while unwinding and feeding the resin film that had been wound in the form of a roll, and the resulting film was heated (dried) at 70° C. for 1 minute to form an antistatic layer A (thickness: 100 nm), and the resulting resin film (2) having the antistatic layer A and the smoothing layer (antistatic layer A/resin film/smoothing layer) was wound in the form of a roll.

Production Example 5

100 parts of dipentaerythritol hexaacrylate ("NK Ester A-DPH" manufactured by Shin-Nakamura Chemical Co., Ltd.) (polyfunctional (meth)acrylate), 3 parts of 1-hydroxycyclohexyl phenyl ketone ("IRGACURE 184" manufactured by BASF) (photopolymerization initiator), 5 parts of silicone resin fine particles ("Tospearl 120" manufactured by Momentive Performance Materials Inc., volume average particle size: 2 µm), and 18 parts of silica nanoparticles ("MIBK-ST" manufactured by Nissan Chemical Industries, Ltd., average particle size: 10 nm) were mixed, and the resulting mixture was diluted with propylene glycol monomethyl ether to prepare an anti-glare hard coat layer-forming solution (3) having a solid content of 30%.

The anti-glare hard coat layer-forming solution (3) was applied to the resin film (provided with the smoothing layer) obtained in Production Example 2 using a bar coating method while unwinding and feeding the resin film that had been wound in the form of a roll, and the resulting film was heated (dried) at 70° C. for 1 minute. UV rays were applied to the film (high-pressure mercury lamp, line speed: 20 m/min, cumulative dose: 100 mJ/cm$^2$, peak intensity: 1.466 W, pass count: 2) using a UV ray irradiation line to form an anti-glare hard coat layer (thickness: 2 µm), and the resulting resin film (3) having the anti-glare hard coat layer and the smoothing layer (anti-glare hard coat layer A/resin film/smoothing layer) was wound in the form of a roll.

Production Example 6

A resin film (4) having a hard coat layer B and a smoothing layer (hard coat layer B/resin film/smoothing layer) was produced (and wound in the form of a roll) in the same manner as in Production Example 3, except that the smoothing layer-forming solution was used as the hard coat layer-forming solution instead of the hard coat layer-forming solution (1).

Production Example 7

A resin film (5) having an antistatic layer B and a smoothing layer (antistatic layer B/resin film/smoothing layer) was produced (and wound in the form of a roll) in the same manner as in Production Example 4, except that the spherical silicone bead fine particles were not added.

Example 1

A perhydropolysilazane ("AZNL110A-20" manufactured by AZ Electronic Materials) was applied to the surface of the smoothing layer provided to the resin film (1) (having the hard coat layer A and the smoothing layer) obtained in Production Example 3 using a bar coating method while unwinding and feeding the resin film (1) that had been wound in the form of a roll, and the resulting film was heated at 120° C. for 2 minutes to form a perhydropolysilazane layer (thickness: 150 nm). Argon (Ar) ions were implanted into the surface of the perhydropolysilazane layer (i.e., the perhydropolysilazane layer was subjected to a modification treatment) using a plasma ion implantation apparatus to form a gas barrier layer. A long gas barrier laminate 1 (hard coat layer A/base (resin film)/smoothing layer/gas barrier layer) was thus obtained.

Table 1 shows the surface roughness and the coefficient of static friction of each layer of the long gas barrier laminate 1, and the evaluation results for the winding capability, the pencil hardness, the surface resistivity, and the anti-glare properties of the long gas barrier laminate 1.

The details of the plasma ion implantation apparatus and the plasma ion implantation conditions used when forming the gas barrier layer are as follows.
Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.
Plasma Ion Implantation Conditions
Plasma-generating gas: Ar
Gas flow rate: 100 sccm
Duty ratio: 0.5%
Repetition frequency: 1,000 Hz
Applied voltage: −10 kV
RF power supply: frequency: 13.56 MHz, applied electric power: 1,000 W
Chamber internal pressure: 0.2 Pa
Pulse width: 5 μsec
Treatment time (ion implantation time): 5 min
Feed speed: 0.2 m/min

Example 2

A long gas barrier laminate 2 was produced in the same manner as in Example 1, except that the resin film (2) (having the antistatic layer A and the smoothing layer) obtained in Production Example 4 was used instead of the resin film (1) (having the hard coat layer A and the smoothing layer).

Table 1 shows the surface roughness and the coefficient of static friction of each layer of the long gas barrier laminate 2.

Example 3

A long gas barrier laminate 3 was produced in the same manner as in Example 1, except that the resin film (3) (having the anti-glare hard coat layer and the smoothing layer) obtained in Production Example 5 was used instead of the resin film (1) (having the hard coat layer A and the smoothing layer).

Table 1 shows the surface roughness and the coefficient of static friction of each layer of the long gas barrier laminate 3.

Comparative Example 1

A long gas barrier laminate 4 was produced in the same manner as in Example 1, except that the resin film (4) (having the hard coat layer B and the smoothing layer) obtained in Production Example 6 was used instead of the resin film (1) (having the hard coat layer A and the smoothing layer).

Table 1 shows the surface roughness and the coefficient of static friction of each layer of the long gas barrier laminate 4.

Comparative Example 2

A long gas barrier laminate 5 was produced in the same manner as in Example 1, except that the resin film (5) (having the antistatic layer B and the smoothing layer) obtained in Production Example 7 was used instead of the resin film (1) (having the hard coat layer A and the smoothing layer).

Table 1 shows the surface roughness and the coefficient of static friction of each layer of the long gas barrier laminate 5.

TABLE 1

|  |  | Example 1 | Example 2 | Example 3 | Comparative Example 1 | Comparative Example 2 |
| --- | --- | --- | --- | --- | --- | --- |
| Gas barrier laminate |  | 1 | 2 | 3 | 4 | 5 |
| Functional layer |  | Hard coat layer A | Antistatic layer A | Anti-glare hard coat layer A | Hard coat layer B | Antistatic layer B |
| Surface roughness of functional layer | Ra (nm) | 6.7 | 14.7 | 10.2 | 3.9 | 4.2 |
|  | Rt (nm) | 670 | 570 | 510 | 50 | 92 |
| Surface roughness of base | Ra (nm) | 11 | 11 | 11 | 11 | 11 |
|  | Rt (nm) | 206 | 206 | 206 | 206 | 206 |
| Surface roughness of smoothing layer | Ra (nm) | 3.9 | 3.9 | 3.9 | 3.9 | 3.9 |
|  | Rt (nm) | 50 | 50 | 50 | 50 | 50 |
| Surface roughness of gas barrier layer | Ra (nm) | 3.9 | 3.9 | 3.9 | 3.9 | 3.9 |
|  | Rt (nm) | 50 | 50 | 50 | 50 | 50 |
| Coefficient of static friction 1 (functional layer/smoothing layer) |  | 0.62 | 0.62 | 0.62 | 2.81 | 1.5 |
| Winding capability (functional layer/smoothing layer) |  | Good | Good | Good | Bad | Bad |

TABLE 1-continued

|  | Example 1 | Example 2 | Example 3 | Comparative Example 1 | Comparative Example 2 |
|---|---|---|---|---|---|
| Coefficient of static friction 2 (functional layer/gas barrier layer) | 0.62 | 0.62 | 0.62 | 2.81 | 1.5 |
| Winding capability (functional layer/gas barrier layer) | Good | Good | Good | Bad | Bad |
| Pencil hardness | H | <HB | H | H | <HB |
| Surface resistivity (Ω/sq.) | >1.00E+12 | 1.00E+10 | >1.00E+12 | >1.00E+12 | 1.00E+10 |
| Anti-glare properties | Bad | Bad | Good | Bad | Bad |

The following were confirmed from the results shown in Table 1.

Blocking and air entrainment did not occur when winding the gas barrier laminates of Examples 1 to 3 (i.e., the gas barrier laminates of Examples 1 to 3 exhibited an excellent winding capability).

On the other hand, at least either blocking or air entrainment occurred when winding the gas barrier laminates of Comparative Examples 1 and 2 (i.e., the gas barrier laminates of Comparative Examples 1 and 2 exhibited an inferior winding capability).

The invention claimed is:

1. A long gas barrier laminate including a functional layer, a base, a smoothing layer, and a gas barrier layer sequentially stacked,
    the functional layer being a hard coat layer or an anti-glare hard coat layer that is formed of cured product of an activated energy ray-curable resin composition including fine particles having an average size of 2 to 3 μm, the content of the fine particles in the activated energy ray-curable resin composition being 0.1 to 4.8 mass %,
    the functional layer being stacked on one side of the base,
    the smoothing layer and the gas barrier layer being sequentially stacked on the other side of the base,
    a coefficient of static friction between a surface of the functional layer that is situated opposite to the base and a surface of the gas barrier layer that is situated opposite to the base being 0.35 to 0.80, and
    a surface of the functional layer that is situated opposite to the base having a total height (Rt) of a roughness of 100 nm or more.

2. The long gas barrier laminate according to claim 1, wherein the surface of the functional layer that is situated opposite to the base has an arithmetic average roughness (Ra) of 5 to 20 nm.

3. The long gas barrier laminate according to claim 1, wherein a coefficient of static friction between the surface of the functional layer that is situated opposite to the base and a surface of the smoothing layer that is situated opposite to the base is 0.35 to 0.80.

4. The long gas barrier laminate according to claim 1, wherein a surface of the smoothing layer that is situated opposite to the base has an arithmetic average roughness (Ra) of 5 nm or less and a total height (Rt) of a roughness profile of 100 nm or less.

5. The long gas barrier laminate according to claim 1, wherein the functional layer is a hard coat layer that is formed of a cured product of an activated energy ray-curable resin composition.

6. The long gas barrier laminate according to claim 1, wherein the smoothing layer is formed of a cured product of an activated energy ray-curable resin composition.

7. The long gas barrier laminate according to claim 1, wherein the gas barrier layer is a layer obtained by subjecting a layer that includes a polysilazane-based compound to a modification treatment.

8. A method for producing the long gas barrier laminate according to claim 1, the method including:
    a step (a-I) that forms the smoothing layer on a base resin film while feeding the base resin film in a given direction to obtain a resin film having the smoothing layer, and winds the resin film having the smoothing layer in the form of a roll;
    a step (a-II) that forms the functional layer on a surface of the resin film having the smoothing layer obtained by the step (a-I) while continuously unwinding and feeding the resin film having the smoothing layer that has been wound in the form of a roll in a given direction to obtain a resin film having the functional layer and the smoothing layer, and winds the resin film having the functional layer and the smoothing layer in the form of a roll; and
    a step (a-III) that forms the gas barrier layer having a coefficient of static friction of 0.35 to 0.80 with respect to the functional layer on a surface of the smoothing layer provided to the resin film having the functional layer and the smoothing layer obtained by the step (a-II) while continuously unwinding and feeding the resin film having the functional layer and the smoothing layer that has been wound in the form of a roll in a given direction to obtain a gas barrier laminate, and winds the gas barrier laminate in the form of a roll.

9. A method for producing the long gas barrier laminate according to claim 1, the method including:
    a step (b-I) that forms the functional layer on a base resin film while feeding the base resin film in a given direction to obtain a resin film having the functional layer, and winds the resin film having the functional layer in the form of a roll;
    a step (b-II) that forms the smoothing layer on the surface of the resin film having the functional layer obtained by the step (b-I) while continuously unwinding and feeding the resin film having the functional layer that has been wound in the form of a roll in a given direction to obtain a resin film having the functional layer and the smoothing layer, and winds the resin film having the functional layer and the smoothing layer in the form of a roll; and
    a step (b-III) that forms the gas barrier layer having a coefficient of static friction of 0.35 to 0.80 with respect to the functional layer on the surface of the smoothing layer provided to the resin film having the functional layer and the smoothing layer obtained by the step (b-II) while continuously unwinding and feeding the resin film having the functional layer and the smoothing layer that has been wound in the form of a roll in a given direction to obtain a gas barrier laminate, and winds the gas barrier laminate in the form of a roll.

* * * * *